(12) United States Patent
Lee et al.

(10) Patent No.: US 9,957,425 B2
(45) Date of Patent: May 1, 2018

(54) ADHESIVE COMPOSITION FOR SEMICONDUCTOR AND ADHESIVE FILM INCLUDING THE SAME

(71) Applicants: Jun Woo Lee, Uiwang-si (KR); Sung Min Kim, Uiwang-si (KR); In Hwan Kim, Uiwang-si (KR); Baek Soung Park, Uiwang-si (KR); Su Mi Lim, Uiwang-si (KR); Jae Won Choi, Uiwang-si (KR)

(72) Inventors: Jun Woo Lee, Uiwang-si (KR); Sung Min Kim, Uiwang-si (KR); In Hwan Kim, Uiwang-si (KR); Baek Soung Park, Uiwang-si (KR); Su Mi Lim, Uiwang-si (KR); Jae Won Choi, Uiwang-si (KR)

(73) Assignee: CHEIL INDUSTRIES, INC., Gumi-si, Gyeongsangbuk-Do (KR)

( * ) Notice: Subject to any disclaimer, the term of this patent is extended or adjusted under 35 U.S.C. 154(b) by 172 days.

(21) Appl. No.: 14/204,128

(22) Filed: Mar. 11, 2014

(65) Prior Publication Data

US 2014/0194555 A1    Jul. 10, 2014

Related U.S. Application Data

(63) Continuation of application No. PCT/KR2012/011157, filed on Dec. 20, 2012.

(30) Foreign Application Priority Data

Dec. 22, 2011  (KR) .................. 10-2011-0140386

(51) Int. Cl.
*C09J 163/00* (2006.01)
*H01L 23/00* (2006.01)
(Continued)

(52) U.S. Cl.
CPC .............. *C09J 163/00* (2013.01); *C09J 7/00* (2013.01); *H01L 24/29* (2013.01); *C08K 5/0025* (2013.01);
(Continued)

(58) Field of Classification Search
CPC ...................................................... C08L 63/00
(Continued)

(56) References Cited

U.S. PATENT DOCUMENTS

2003/0080397 A1* 5/2003 Sakuyama ............ H01L 21/563
257/667
2003/0091842 A1* 5/2003 Murakami ............. H05K 3/281
428/473.5
(Continued)

FOREIGN PATENT DOCUMENTS

CN   101205444 A   6/2008
CN   102108276 A   6/2011
(Continued)

OTHER PUBLICATIONS

Chinese Office Action dated Apr. 30, 2015 in Corresponding Chinese Patent Application No. 201280070440.3
(Continued)

*Primary Examiner* — Megan McCulley
(74) *Attorney, Agent, or Firm* — Lee & Morse, P.C.

(57) ABSTRACT

An adhesive composition for semiconductors, an adhesive film, and a semiconductor device, wherein, in a curing process including a first stage at a temperature ranging from 120° C. to 130° C. for 1 to 20 minutes, a second stage at a temperature ranging from 140° C. to 150° C. for 1 to 10 minutes, a third stage at a temperature ranging from 160° C. to 180° C. for 30 seconds to 10 minutes, and a fourth stage at a temperature ranging from 160° C. to 180° C. for 10 minutes to 2 hours, the adhesive film has a DSC curing rate (Continued)

in the first stage that is 40% or less of a total curing rate, a DSC curing rate in the fourth stage that is 30% to 60% higher than a DSC curing rate in the third stage, and DSC curing rates in each of the second and third stages that are 5% or more higher than a DSC curing rate of a preceding stage thereof.

15 Claims, 1 Drawing Sheet

(51) Int. Cl.
    *C09J 7/00*     (2018.01)
    *C08L 63/00*     (2006.01)
    *C08K 5/00*     (2006.01)
    *C08K 5/3445*     (2006.01)

(52) U.S. Cl.
    CPC ............ *C08K 5/3445* (2013.01); *C08L 63/00* (2013.01); *C09J 2201/622* (2013.01); *C09J 2203/326* (2013.01); *C09J 2205/102* (2013.01); *C09J 2463/00* (2013.01); *H01L 24/27* (2013.01); *H01L 24/32* (2013.01); *H01L 24/83* (2013.01); *H01L 24/85* (2013.01); *H01L 2224/27003* (2013.01); *H01L 2224/27436* (2013.01); *H01L 2224/293* (2013.01); *H01L 2224/2919* (2013.01); *H01L 2224/2929* (2013.01); *H01L 2224/29387* (2013.01); *H01L 2224/32145* (2013.01); *H01L 2224/83191* (2013.01); *H01L 2224/83885* (2013.01); *H01L 2224/85* (2013.01); *H01L 2224/92247* (2013.01); *H01L 2924/00014* (2013.01)

(58) Field of Classification Search
    USPC ........................................................ 523/434
    See application file for complete search history.

(56) References Cited

U.S. PATENT DOCUMENTS

| | | | | |
|---|---|---|---|---|
| 2004/0197571 | A1* | 10/2004 | Hiroshige | B32B 27/38 428/424.2 |
| 2005/0037207 | A1* | 2/2005 | Komiyama | C09D 163/00 428/413 |
| 2005/0224173 | A1* | 10/2005 | Kitano | C09K 3/10 156/307.7 |
| 2006/0009579 | A1* | 1/2006 | Miyawaki | C08F 283/10 525/31 |
| 2006/0102882 | A1* | 5/2006 | Bedner | B32B 27/04 252/601 |
| 2008/0261049 | A1* | 10/2008 | Hayashi | H01B 1/22 428/418 |
| 2010/0076119 | A1* | 3/2010 | Ishizawa | C08G 59/226 523/400 |
| 2013/0143363 | A1* | 6/2013 | Kim | C08L 63/00 438/118 |
| 2013/0154125 | A1* | 6/2013 | Kim | H01L 24/50 257/783 |
| 2013/0165603 | A1* | 6/2013 | Wi | C08G 59/50 525/523 |

FOREIGN PATENT DOCUMENTS

| | | |
|---|---|---|
| JP | H11-343476 A | 12/1999 |
| JP | 2006-131690 A | 5/2006 |
| JP | 2008-069243 A | 3/2008 |
| KR | 10-2004-0070210 A | 8/2004 |
| KR | 10-2010-0077792 A | 7/2010 |

OTHER PUBLICATIONS

International Search Report dated Apr. 10, 2013 in PCT/KR2012/011157.

\* cited by examiner

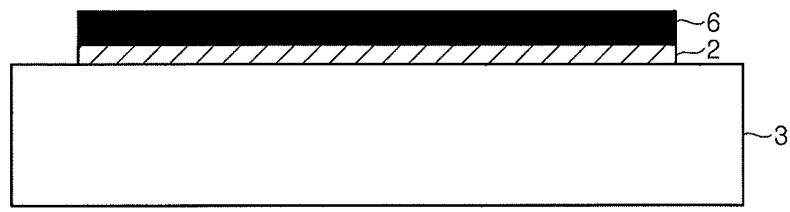

ADHESIVE COMPOSITION FOR SEMICONDUCTOR AND ADHESIVE FILM INCLUDING THE SAME

CROSS-REFERENCE TO RELATED APPLICATION

This application is a continuation of pending International Application No. PCT/KR2012/011157, entitled "ADHESIVE COMPOSITION FOR SEMICONDUCTOR AND ADHESIVE FILM COMPRISING THE SAME," which was filed on Dec. 20, 2011, the entire contents of which are hereby incorporated by reference.

BACKGROUND

1. Field

Embodiments relate to an adhesive composition for semiconductors and an adhesive film including the same.

2. Description of the Related Art

A die-attach film (DAF) for multi-chip packaging (MCP) may be subjected to a die-bonding process at a temperature of 100° C. to 120° C. and a die-attach curing process at a temperature of 125° C. to 150° C. for about 1 hour. Reducing curing time instead of curing temperature by reducing the curing time from about 1 hour to less than 1 hour at a temperature of 125° C.~150° C. without deteriorating reliability has been considered.

SUMMARY

Embodiments are directed to an adhesive composition for semiconductors and an adhesive film including the same.

The embodiments may be realized by providing an adhesive film for semiconductors, wherein, in a curing process including a first stage at a temperature ranging from 120° C. to 130° C. for 1 to 20 minutes, a second stage at a temperature ranging from 140° C. to 150° C. for 1 to 10 minutes, a third stage at a temperature ranging from 160° C. to 180° C. for 30 seconds to 10 minutes, and a fourth stage at a temperature ranging from 160° C. to 180° C. for 10 minutes to 2 hours, the adhesive film has a DSC curing rate in the first stage that is 40% or less of a total curing rate, a DSC curing rate in the fourth stage that is 30% to 60% higher than a DSC curing rate in the third stage, and DSC curing rates in each of the second and third stages that are 5% or more higher than a DSC curing rate of a preceding stage thereof.

The DSC curing rate in the second stage may be 5% to 50% higher than the DSC curing rate in the first stage, and the DSC curing rate in the third stage may be 5% to 25% higher than the DSC curing rate in the second stage.

The adhesive film may include an imidazole curing accelerator represented by Formula 1 or 2, below:

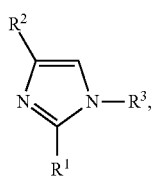

(1)

wherein, in Formula 1, $R^1$ is hydrogen or a $C_1$-$C_{12}$ alkyl group, $R^2$ is hydrogen or a $C_1$-$C_6$ alkyl group, $R^3$ is a $C_1$-$C_6$ alkyl group bonded to an unsubstituted or substituted aryl or unsubstituted or substituted heteroaryl group, the substituted aryl group or the substituted heteroaryl group being substituted by one to three substituents selected from —COOH and —NH₂,

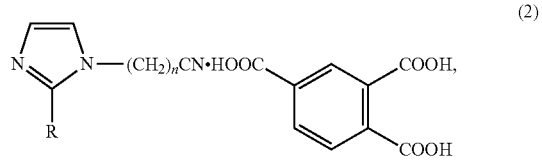

(2)

wherein, in Formula 2, R is a $C_1$-$C_{14}$ alkyl group or a phenyl group and n is an integer of 1 to 6.

The imidazole curing accelerator may be selected from the group of:

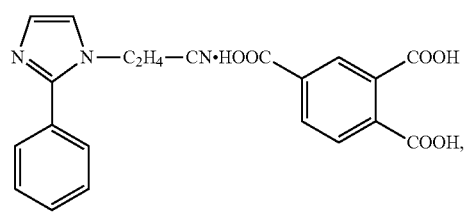

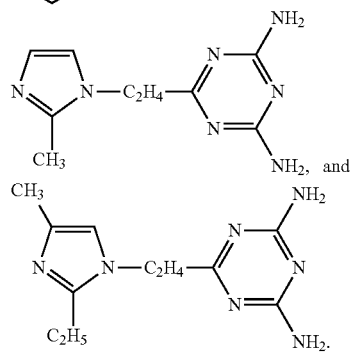

The embodiments may be realized by providing an adhesive film for semiconductors, the adhesive film having a void proportion of less than 10% after sequentially curing at 120° C. to 130° C. for 1 to 20 minutes and at 140° C. to 150° C. for 1 to 10 minutes, and a void proportion of less than 20% after sequentially curing at 120° C. to 130° C. for 1 to 20 minutes, at 140° C. to 150° C. for 1 to 10 minutes and at 160° C. to 180° C. for 30 seconds to 10 minutes.

The adhesive film may have a die shear strength of 1 kgf/chip or more after chip bonding at 120° C. for 1 second and followed by sequentially curing at 120° C. to 130° C. for 1 to 20 minutes and at 140° C. to 150° C. for 1 to 10 minutes.

The adhesive film may have a die shear strength of 10.0 kgf/chip or more after chip bonding at 120° C. for 1 second and followed by sequentially curing at 120° C. to 130° C. for 1 to 20 minutes, at 140° C. to 150° C. for 1 to 10 minutes, at 160° C. to 180° C. for 30 seconds to 10 minutes and at 160° C. to 180° C. for 10 minutes to 2 hours, and reflow three times at 260° C.

The embodiments may be realized by providing an adhesive composition for semiconductors, the adhesive composition including a thermoplastic resin; an epoxy resin; at least one curing resin selected from a phenolic curing resin and an amine curing resin; an imidazole curing accelerator represented by Formula 1 or 2, below; and a filler,

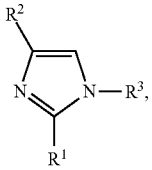

(1)

wherein, in Formula 1, $R^1$ is hydrogen or a $C_1$-$C_{12}$ alkyl group, $R^2$ is hydrogen or a $C_1$-$C_6$ alkyl group, $R^3$ is a $C_1$-$C_6$ alkyl group bonded to an unsubstituted or substituted aryl or unsubstituted or substituted heteroaryl group, the substituted aryl group or the substituted heteroaryl group being substituted by one to three substituents selected from —COOH and —NH$_2$,

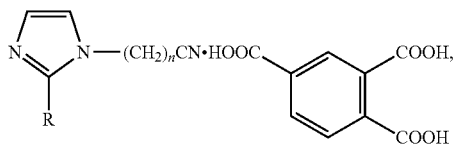

(2)

wherein, in Formula 2, R is a $C_1$-$C_{14}$ alkyl group or a phenyl group and n is an integer of 1 to 6.

The composition may include, based on 100 parts by weight of the adhesive composition in terms of solid content 10 to 60 parts by weight of the thermoplastic resin; 15 to 40 parts by weight of the epoxy resin; 5 to 25 parts by weight of the at least one curing resin selected from phenolic curing resins and amine curing resins; 0.05 to 10 parts by weight of the imidazole curing accelerator represented by Formula 1 or 2; and 1 to 30 parts by weight of the filler.

An amount of the thermoplastic resin may be less than or equal to a sum of the amounts of the epoxy resin and the curing agent, in terms of solid content.

The embodiments may be realized by providing a semiconductor device connected using the adhesive film for semiconductors or the adhesive composition for semiconductors according to an embodiment.

BRIEF DESCRIPTION OF THE DRAWING

Features will be apparent to those of skill in the art by describing in detail exemplary embodiments with reference to the attached drawing in which:

FIG. 1 illustrates a side sectional view of a semiconductor device according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

An embodiment relates to an adhesive film for semiconductors. In a curing process including a first stage at a temperature ranging from 120° C. to 130° C. for 1 to 20 minutes, a second stage at a temperature ranging from 140° C. to 150° C. for 1 to 10 minutes, a third stage at a temperature ranging from 160° C. to 180° C. for 30 seconds to 10 minutes, and a fourth stage at a temperature ranging from 160° C. to 180° C. for 10 minutes to 2 hours, the adhesive film may have a DSC curing rate in the first stage that is 40% or less of a total curing rate, a DSC curing rate in the fourth stage that is 30% to 60% higher than a DSC curing rate in the third stage, and DSC curing rates in each of the second and third stages that are 5% or more higher than a DSC curing rate of a preceding stage thereof.

In an implementation, in the curing process including the first stage at a temperature ranging from 120° C. to 130° C. for 1 to 20 minutes, the second stage at a temperature ranging from 140° C. to 150° C. for 1 to 10 minutes, the third stage at a temperature ranging from 160° C. to 180° C. for 30 seconds to 10 minutes, and the fourth stage at a temperature ranging from 160° C. to 180° C. for 10 minutes to 2 hours, a DSC curing rate in the first stage may be 40% or less of the total curing rate, a DSC curing rate in the second stage may be 5% to 50% higher than the DSC curing rate in the first stage, a DSC curing rate in the third stage may be 5% to 25% higher than the DSC curing rate in the second stage, and a DSC curing rate in the fourth stage may be 30% to 60% higher than the DSC curing rate in the third stage.

The first to fourth stages may simulate or correspond to a chip bonding process, a wire bonding process, an epoxy mold curing process, and a post-mold curing process in a process of manufacturing semiconductors, respectively. For example, the first stage at a temperature ranging from 120° C. to 130° C. for 1 to 20 minutes may simulate or correspond to an oven curing process after die-attachment, the second stage at a temperature ranging from 140° C. to 150° C. for 1 to 10 minutes may simulate or correspond to a wire bonding process on a hot plate, the third stage at a temperature ranging from 160° C. to 180° C. for 30 seconds to 10 minutes may simulate or correspond to an epoxy mold curing (EMC) process, and the fourth stage at a temperature ranging from 160° C. to 180° C. for 10 minutes to 2 hours may simulate or correspond to a post-mold curing (PMC) process.

The adhesive film for semiconductors according to an embodiment may allow the DSC curing rate to increase in a stepwise manner from the first stage to the fourth stage, whereby a minimal curing rate required for each of the stages is secured while remaining curing rate required for a subsequent thermal process, thereby suppressing expansion and generation of voids due to increase in inner temperature of DAF caused by a highly exothermic curing reaction.

For example, the adhesive film for semiconductors according to an embodiment may have a characteristic DSC curing rate pattern in each stage, wherein the DSC curing rate of the adhesive film in the first stage may be 40% or less of the total curing rate, the DSC curing rate of the adhesive film in the fourth stage may be 30% to 60% higher than the DSC curing rate in the third stage, and the DSC curing rates of the adhesive film in each of the second and third stages may be 5% or more higher than the DSC curing rate of a preceding stage thereof. In an implementation, the DSC curing rate of the adhesive film in the first stage may be 40% or less of the total curing rate, the DSC curing rate of the adhesive film in the second stage may be 5% to 50% higher than the curing rate in the first stage, the DSC curing rate of the adhesive film in the third stage may be 5% to 25% higher than the curing rate in the second stage, the DSC curing rate of the adhesive film in the fourth stage may be 30% to 60% higher than the curing rate in the third stage.

In an implementation, the DSC curing rate in the first stage may be 40% or less of the total curing rate.

In an implementation, the DSC curing rate in the first stage may be 10% to 40% of the total curing rate. Each curing rate may be a minimal curing rate required for securing reliability of the adhesive film for semiconductors in a subsequent thermal process.

The DSC curing rate in the second stage may be 5% or higher than the curing rate in the first stage, e.g., 5% to 50% higher than the curing rate in the first stage. During die-attach curing of the first stage, the adhesive film may increase in flowability, and curing may be carried out while filling voids generated upon die-attachment. At this time, if sufficient curing is not obtained together with increase in flowability, voids may be generated due to exposure to high temperature in subsequent processes (wire bonding, EMC, etc.) before sufficiently stable increase in curing density. In an implementation, the DSC curing rate in the second stage may be set to be 5% to 50% higher than the curing rate in the first stage, thereby minimizing generation and expansion of voids including bubble type voids.

The DSC curing rate in the third stage may be 5% or more (e.g., at least 5%) higher than the curing rate in the second stage, e.g., 5% to 25% higher than the curing rate in the second stage. In an implementation, the DSC curing rate in the third stage may be 18% or less (e.g. no more than 18%) higher than the curing rate in the second stage.

The DSC curing rate in the fourth stage may be 30% to 60% higher than the curing rate in the third stage. In an implementation, the DSC curing rate in the fourth stage may be 40% to 60% higher than the curing rate in the third stage.

When the DSC curing rate in the fourth stage is 30% to 60% higher than the curing rate in the third stage, it is possible to achieve effective removal of voids by imparting the residual curing rate to the PMC process.

The adhesive film for semiconductors according to an embodiment may include an imidazole curing accelerator represented by one of the following Formula 1 or 2.

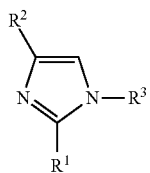
(1)

In Formula 1, $R^1$ may be hydrogen or a $C_1$-$C_{12}$ alkyl group, $R^2$ may be hydrogen or a $C_1$-$C_6$ alkyl group, $R^3$ may be a $C_1$-$C_6$ alkyl group bonded to an unsubstituted or substituted aryl or unsubstituted or substituted heteroaryl group. In an implementation, the substituted aryl group or the substituted heteroaryl group may be substituted by or with one to three substituents selected from —COOH and —NH$_2$.

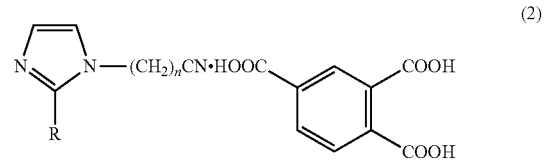
(2)

In Formula 2, R may be a $C_1$-$C_{14}$ alkyl group or a phenyl group and n may be an integer of 1 to 6.

In an implementation, in Formula 1, $R^1$ may be a $C_1$-$C_{12}$ alkyl group, $R^2$ may be hydrogen or a $C_1$-$C_4$ alkyl group, and $R^3$ may be a $C_1$-$C_4$ alkyl group bonded to a heteroaryl group substituted by one to three substituents of NH$_2$. In an implementation, in Formula 1, $R^1$ may be hydrogen, methyl or ethyl, $R^2$ may be hydrogen, methyl or ethyl, and $R^3$ may be ethyl bonded to a heteroaryl group substituted by two substituents of NH$_2$. In an implementation, the heteroaryl may be triazole. In an implementation, in Formula 2, R may be a phenyl or $C_8$ to $C_{10}$ alkyl group.

In an implementation, the imidazole curing accelerator may include at least one of the following compounds:

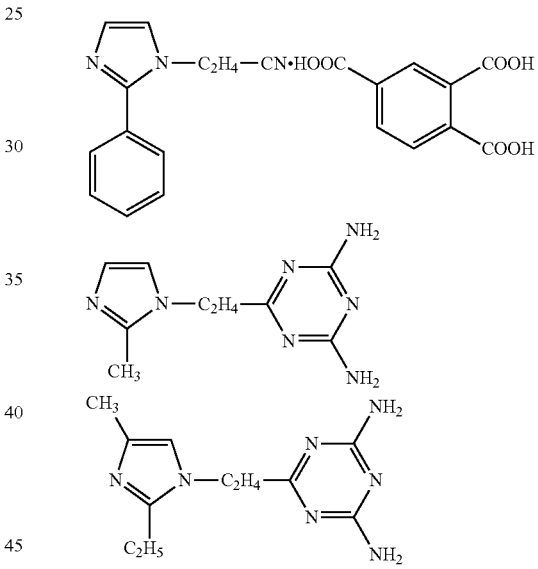

As used herein, the term "aryl" may be interchangeable with the term "aryl group" and may refer to a homocyclic aromatic radical group containing a monocyclic or polycyclic ring. Examples of aryl groups may include phenyl, biphenyl, naphthalenyl, phenanthrenyl, anthracenyl, tetralinyl, fluorenyl, indenyl, and indanyl, each optionally substituted by or with one or more substituents.

As used herein, the term "heteroaryl" may be interchangeable with the term "heteroaryl group" and may refer to an aromatic heterocyclic group containing either a monocyclic or polycyclic ring. In bonding ring systems, one or more heteroatoms may be present only in a single ring or may be present in two or more rings. Examples of heteroaryl groups may include benzothiazyl, benzoxanyl, quinazolinyl, quinolinyl, isoquinolinyl, quinoxalinyl, pyridyl, pyrrolyl, oxazolyl, indolyl thienyl, triazole, and tetrazole. The heteroatom may be independently selected from oxygen, sulfur, and nitrogen.

Another embodiment relates to an adhesive composition for semiconductors. The adhesive composition may include, e.g., a thermoplastic resin; an epoxy resin; at least one curing resin (selected from phenolic curing resins and amine curing resins); and a filler.

In an implementation, the adhesive composition may further include an imidazole curing accelerator represented by Formula 1 or 2, below.

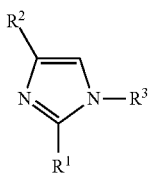

(1)

In Formula 1, $R^1$ may be hydrogen or a $C_1$-$C_{12}$ alkyl group, $R^2$ may be hydrogen or a $C_1$-$C_6$ alkyl group, $R^3$ may be a $C_1$-$C_6$ alkyl group bonded to an unsubstituted or substituted aryl or unsubstituted or substituted heteroaryl group. In an implementation, the substituted aryl group or the substituted heteroaryl group may be substituted by or with one to three substituents selected from —COOH and —NH$_2$.

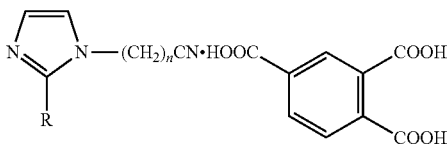

(2)

In Formula 2, R may be a $C_1$-$C_{14}$ alkyl group or a phenyl group and n is an integer of 1 to 6.

In an implementation, the adhesive composition for semiconductors may include, based on 100 parts by weight of the adhesive composition in terms of solid content, (a) 10 to 60 parts by weight of the thermoplastic resin; (b) 15 to 40 parts by weight of the epoxy resin; (c) 5 to 25 parts by weight of the at least one curing resin selected from phenolic curing resins and amine curing resins; (d) 0.05 to 10 parts by weight of the imidazole curing accelerator represented by Formula 1 or 2; and (e) 1 to 30 parts by weight of the filler.

Another embodiment relates to an adhesive composition for semiconductors, the composition including, e.g., a thermoplastic resin, an epoxy resin, a curing agent, and a curing accelerator. In an implementation, an amount of the thermoplastic resin may be less than or equal to a sum of the amounts of the epoxy resin and the curing agent in terms of solid content. The curing accelerator may be, e.g., an imidazole curing accelerator represented by Formula 1 or 2.

Another embodiment relates to an adhesive film for semiconductors. The adhesive film may have a void proportion of less than 10% after sequentially curing at 120° C. to 130° C. for 1 to 20 minutes and at 140° C. to 150° C. for 1 to 10 minutes, and a void proportion of less than 20% after sequentially curing at 120° C. to 130° C. for 1 to 20 minutes, at 140° C. to 150° C. for 1 to 10 minutes and at 160° C. to 180° C. for 30 seconds to 10 minutes. In an implementation, the adhesive film may have a void proportion of less than 5% after sequentially curing at 120° C. to 130° C. for 1 to 20 minutes and at 140° C. to 150° C. for 1 to 10 minutes, and a void proportion of less than 10% after sequentially curing at 120° C. to 130° C. for 1 to 20 minutes, at 140° C. to 150° C. for 1 to 10 minutes and at 160° C. to 180° C. for 30 seconds to 10 minutes.

If the adhesive film were to have insufficient curing density upon curing at 140° C. to 150° C. for 1 to 10 minutes and at 160° C. to 180° C. for 30 seconds to 10 minutes, moisture and low molecular weight materials within the adhesive film could evaporate and boil due to temperature increase in thermal processes, thereby creating bubble type voids. The adhesive film according to an embodiment may allow the curing rate to increase in a stepwise manner to help improve curing density required for each stage, thereby minimizing generation of voids including bubble type voids. Thus, according to an embodiment, the adhesive film may have a void proportion of less than 20%, e.g., less than 10%, even though voids including the bubble type voids may be generated in the adhesive film.

For example, the adhesive film according to an embodiment may allow the curing rate to increase in a stepwise manner, thereby preventing generation and spreading of voids during wire bonding and EMC processes.

According to an embodiment, the adhesive film for semiconductors may have a die shear strength of 1 kgf/chip or more after chip bonding at 120° C. for 1 second and followed by sequentially curing at 120° C. to 130° C. for 1 to 20 minutes and at 140° C. to 150° C. for 1 to 10 minutes. In addition, the adhesive film for semiconductors may have a die shear strength of 10.0 kgf/chip or more after chip bonding at 120° C. for 1 second and followed by sequentially curing at 120° C. to 130° C. for 1 to 20 minutes, at 140° C. to 150° C. for 1 to 10 minutes, at 160° C. to 180° C. for 30 seconds to 10 minutes and at 160° C. to 180° C. for 10 minutes to 2 hours, and reflow three times at 260° C.

Next, each component of the adhesive composition for semiconductors, e.g., the polymer resin, the epoxy resin, the curing agent and the curing accelerator, will be described in detail.

Thermoplastic Resin

Examples of thermoplastic resins suitable for use in the adhesive composition may include polyimide resins, polystyrene resins, polyethylene resins, polyester resins, polyamide resins, butadiene rubbers, acryl rubbers, (meth)acrylate resins, urethane resins, polyphenylene ether resins, polyether imide resins, phenoxy resins, polycarbonate resins, polyphenylene ether resins, modified polyphenylene ether resins, and mixtures thereof. In an implementation, the thermoplastic resin may contain an epoxy group. In an implementation, an epoxy group containing (meth)acrylic copolymer may be used as the thermoplastic resin.

The thermoplastic resin may have a glass transition temperature of −30° C. to 80° C., e.g., 5° C. to 60° C. or 5° C. to 35° C. Within this range of glass transition temperature of the thermoplastic resin, the composition may secure high flowability to exhibit excellent void removing capability, and may provide high adhesion and reliability.

In an implementation, the thermoplastic resin may have a weight average molecular weight of 50,000 to 5,000,000 g/mol.

The thermoplastic resin may be present in an amount of 10 to 40 parts by weight, based on 100 parts by weight of the adhesive composition in terms of solid content, e.g., 15~35 parts by weight or 20~30 parts by weight. Maintaining the amount of the thermoplastic resin at 10 parts by weight or greater may be desirable in terms of void generation and reliability.

In an implementation, a weight ratio of the thermoplastic resin (A) to a mixture of the epoxy resin (B) and the curing agent (C) may be (A)≤(B)+(C). Within this range, void generation may be advantageously suppressed.

Epoxy Resin

The epoxy resin is curable and may impart adhesion to the composition. The epoxy resin may include, e.g., a liquid epoxy resin, a solid epoxy resin, or a mixture thereof.

Examples of suitable liquid epoxy resins may include bisphenol A type liquid epoxy resins, bisphenol F type liquid epoxy resins, tri- or higher polyfunctional liquid epoxy resins, rubber-modified liquid epoxy resins, urethane-modified liquid epoxy resins, acrylic modified liquid epoxy resins, and photosensitive liquid epoxy resins. These liquid epoxy resins may be used alone or as a mixture thereof. In an implementation, a bisphenol A type liquid epoxy resin may be used.

The liquid epoxy resin may have an epoxy equivalent weight of about 100 g/eq. to about 1500 g/eq. In an implementation, the liquid epoxy resin may have an epoxy equivalent weight of about 150 g/eq. to about 800 g/eq., e.g., about 150 g/eq. to about 400 g/eq. Within this range, a cured product with good adhesion and heat resistance may be obtained while maintaining the glass transition temperature.

The liquid epoxy resin may have a weight average molecular weight of 100 to 1,000 g/mol. This range may be advantageous in terms of high flowability.

The solid epoxy resin may be a solid or quasi-solid at room temperature and may have one or more functional groups. The solid epoxy resin may have a softening point (Sp) of 30° C. to 100° C. Examples of suitable solid epoxy resins may include bisphenol epoxy resins, phenol novolac epoxy resins, o-cresol novolac epoxy resins, polyfunctional epoxy resins, amine epoxy resins, heterocyclic epoxy resins, substituted epoxy resins, naphthol-based epoxy resins, biphenyl-based epoxy resins, and derivatives thereof.

Commercially available solid epoxy resins may include the following. Examples of bisphenol epoxy resins may include YD-017H, YD-020, YD020-L, YD-014, YD-014ER, YD-013K, YD-019K, YD-019, YD-017R, YD-017, YD-012, YD-011H, YD-011S, YD-011, YDF-2004, YDF-2001 (Kukdo Chemical Co., Ltd.), etc. Examples of phenol novolac epoxy resins may include EPIKOTE 152 and EPIKOTE 154 (Yuka Shell Epoxy Co., Ltd.); EPPN-201 and EPPN-501H (Nippon Kayaku Co., Ltd.); DN-483 (Dow Chemical Company); YDPN-641, YDPN-638A80, YDPN-638, YDPN-637, YDPN-644, YDPN-631 (Kukdo Chemical Co., Ltd.), etc. Examples of o-cresol novolac epoxy resins may include: YDCN-500-1P, YDCN-500-2P, YDCN-500-4P, YDCN-500-5P, YDCN-500-7P, YDCN-500-8P, YDCN-500-10P, YDCN-500-80P, YDCN-500-80PCA60, YDCN-500-80PBC60, YDCN-500-90P, YDCN-500-90PA75 (Kukdo Chemical Co., Ltd.); EOCN-102S, EOCN-103S, EOCN-104S, EOCN-1012, EOCN-1025, EOCN-1027 (Nippon Kayaku Co., Ltd.); YDCN-701, YDCN-702, YDCN-703, YDCN-704 (Tohto Kagaku Co., Ltd.); Epiclon N-665-EXP (Dainippon Ink and Chemicals, Inc.), etc. Examples of bisphenol novolac epoxy resins may include KBPN-110, KBPN-120, KBPN-115 (Kukdo Chemical Co., Ltd.), etc. Examples of polyfunctional epoxy resins may include Epon 1031 S (Yuka Shell Epoxy Co., Ltd.); Araldite 0163 (Ciba Specialty Chemicals); Detachol EX-611, Detachol EX-614, Detachol EX-614B, Detachol EX-622, Detachol EX-512, Detachol EX-521, Detachol EX-421, Detachol EX-411, Detachol EX-321 (NAGA Celsius Temperature Kasei Co., Ltd.); EP-5200R, KD-1012, EP-5100R, KD-1011, KDT-4400A70, KDT-4400, YH-434L, YH-434, YH-300 (Kukdo Chemical Co., Ltd.), etc. Examples of amine epoxy resins may include EPIKOTE 604 (Yuka Shell Epoxy Co., Ltd.); YH-434 (Tohto Kagaku Co., Ltd.); TETRAD-X and TETRAD-C (Mitsubishi Gas Chemical Company Inc.); ELM-120 (Sumitomo Chemical Industry Co., Ltd.), etc. Examples of heterocyclic epoxy resins may include PT-810 (Ciba Specialty Chemicals). Examples of substituted epoxy resins include: ERL-4234, ERL-4299, ERL-4221, ERL-4206 (UCC Co., Ltd.), etc. Examples of naphthol epoxy resins may include: Epiclon HP-4032, Epiclon HP-4032D, Epiclon HP-4700, and Epiclon HP-4701 (Dainippon Ink and Chemicals, Inc.). Examples of non-phenolic epoxy resins may include YX-4000H (Japan Epoxy Resin), YSLV-120TE, GK-3207 (Nippon steel chemical), NC-3000 (Nippon Kayaku), etc. These epoxy resins may be used alone or as mixtures.

The epoxy resin may be present in an amount of 15 to 40 parts by weight, e.g., 20 to 35 parts by weight, based on 100 parts by weight of the adhesive film composition in terms of solid content. Within this range, high reliability and excellent mechanical properties can be attained.

Curing Agent

The curing agent may include at least one selected from phenolic curing agents and amine curing agents.

The phenolic curing agent may include, e.g., bisphenol resins, which contain two or more phenolic hydroxyl groups in a single molecule and exhibit excellent electrolytic corrosion resistance upon hydrolysis, such as bisphenol A, bisphenol F, bisphenol S, and the like; phenol novolac resins; bisphenol A novolac resins; and phenolic resins such as xylene, cresol novolac, biphenyl resins, and the like. Preferably, phenol novolac resins or bisphenol A novolac resins. Examples of commercially available phenolic curing agents may include H-1, H-4, HF-1M, HF-3M, HF-4M, and HF-45 (Meiwa Plastic Industries Co., Ltd.); examples of paraxylene phenolic curing agents may include MEH-78004S, MEH-7800SS, MEH-7800S, MEH-7800M, MEH-7800H, MEH-7800HH, and MEH-78003H (Meiwa Plastic Industries Co., Ltd.), PH-F3065 (Kolong Industries Co., Ltd.); examples of biphenyl curing agents may include MEH-7851SS, MEH-7851S, MEH-7851M, MEH-7851H, MEH-78513H, MEH-78514H (Meiwa Plastic Industries Co., Ltd.), and KPH-F4500 (Kolong Industries Co., Ltd.); and examples of triphenylmethyl curing agents may include MEH-7500, MEH-75003S, MEH-7500SS, MEH-7500S, MEH-7500H (Meiwa Plastic Industries Co., Ltd.), etc. These may be used alone or as mixtures thereof.

The amine curing agent may be an aromatic amine curing agent in terms of curing rate adjustment. In an implementation, the amine curing resin may be an aromatic compound having two or more amine groups in a single molecule. In an implementation, the amine curing agent may be represented by, e.g., one of Formulae 3 to 7, below.

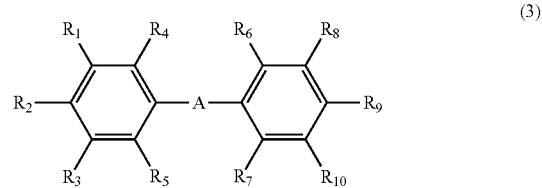

(3)

In Formula 3, A may be a single bond or may be selected from the group of —$CH_2$—, —$CH_2CH_2$—, —$SO_2$—, —NHCO—, —$C(CH_3)_2$—, and —O—, $R_1$ to $R_{10}$ may be each independently hydrogen, a $C_1$-$C_4$ alkyl group, a $C_1$-$C_4$ alkoxy group, and amine groups, with the proviso that $R_1$ to $R_{10}$ include at least two amine groups.

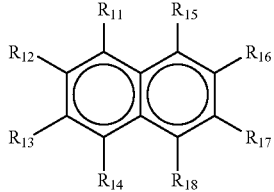
(4)

In Formula 4, $R_{11}$ to $R_{18}$ may include at least one amine group, and may further include a $C_1$ to $C_4$ alkyl group, an alkoxy group, an hydroxyl group, a cyanide group, or halogen.

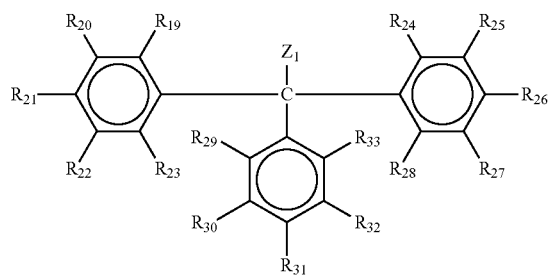
(5)

In Formula 5, $Z_1$ may be hydrogen, a C1 to C4 alkyl group, an alkoxy group, or a hydroxyl group; $R_{19}$ to $R_{33}$ may include at least one amine group, and may further include hydrogen, a $C_1$ to $C_4$ alkyl group, an alkoxy group, a hydroxyl group, a cyanide group or halogen.

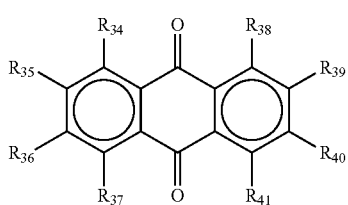
(6)

In Formula 6, $R_{34}$ to $R_{41}$ may include at least one amine group, and may further include hydrogen, a $C_1$ to $C_4$ alkyl group, an alkoxy group, a hydroxyl group, a cyanide group or halogen.

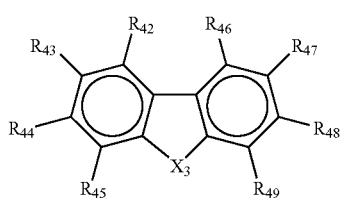
(7)

In Formula 7, $X_3$ may be selected from the group of —$CH_2$—, —NH—, —$SO_2$—, —S—, and —O—; and $R_{42}$ to $R_{49}$ may include at least one amine group, and may further include hydrogen, a $C_1$ to $C_4$ alkyl group, an alkoxy group, a hydroxyl group, a cyanide group or halogen.

Examples of the curing agent of Formula 3 may include 3,3'-diaminobenzidine, 4,4'-diaminodiphenyl methane, 4,4' or 3,3'-diaminodiphenyl sulfone, 4,4'-diaminobenzophenon, paraphenylene diamine, metaphenylene diamine, metatoluene diamine, 4,4'-diaminodiphenyl ether, 4,4' or 3,3'-diaminobenzophenon, 1,4' or 1,3'-bis(4 or 3-aminocumyl)benzene, 1,4' bis(4 or 3-aminophenoxy)benzene, 2,2'-bis[4-(4 or 3-aminophenoxy)phenyl]propane, bis[4-(4 or 3-aminophenoxy)phenyl]sulfone, 2,2'-bis[4-(4 or 3-aminophenoxy)phenyl]hexafluorosulfone, 2,2'-bis[4-(4 or 3-aminophenoxy)phenyl]hexafluoropropane, 4,4'-diamino-3,3',5,5'-tetrabutyldiphenylketone, 4,4'-diamino-3,3',5,5'-tetraethyldiphenylketone, 4,4'-diamino-3,3',5,5'-tetra-n-propylenediphenylketone, 4,4'-diamino-3,3',5,5'-tetraisopropyldiphenylketone, 4,4'-diamino-3,3',5,5'-tetramethyldiphenylketone, 4,4'-diamino-3,3',5,5'-tetra-n-propyldiphenylmethane, 4,4'-diamino-3,3'5,5-tetramethyldiphenylmethane, 4,4'-diamino-3,3'5,5'-tetraisopropyldiphenylmethane, 4,4'-diamino-3,3'5,5'-tetraethyldiphenylmethane, 4,4'-diamino-3,3'-dimethyl-5,5'-diethyldiphenylmethane, 4,4'-diamino-3,3'-dimethyl-5,5'-diisopropyldiphenylmethane, 4,4'-diamino-3,3'-diethyl-5,5'-diethyldiphenylmethane, 4,4'-diamino-3,5'-dimethyl-3',5'-diethyldiphenylmethane, 4,4'-diamino-3,5-dimethyl-3',5'-diisopropyldiphenylmethane, 4,4'-diamino-3,5-diethyl-3',5'-dibutyldiphenylmethane, 4,4'-diamino-3,5-diisopropyl-3',5'-dibutyldiphenylmethane, 4,4'-diamino-3,3'-diisopropyl-5,5'-dibutyldiphenylmethane, 4,4'-diamino-3,3'-dimethyl-5',5'-dibutyldiphenylmethane, 4,4'-diamino-3,3'-diethyl-5',5'-dibutyldiphenylmethane, 4,4'-diamino-3,3'-dimethyldiphenylmethane, 4,4'-diamino-3,3'-diethyldiphenylmethane, 4,4'-diamino-3,3'-di-n-propyldiphenylmethane, 4,4'-diamino-3,3'-diisopropyldiphenylmethane, 4,4'-diamino-3,3'-dibutyldiphenylmethane, 4,4'-diamino-3,3',5-trimethyldiphenylmethane, 4,4'-diamino-3,3',5-triethyldiphenylmethane, 4,4'-diamino-3,3',5-tri-n-propyldiphenylmethane, 4,4'-diamino-3,3',5-triisopropyldiphenylmethane, 4,4'-diamino-3,3',5-tributyldiphenylmethane, 4,4'-diamino-3-methyl-3'-ethyldiphenylmethane, 4,4'-diamino-3-methyl-3'-isopropyldiphenylmethane, 4,4'-diamino-3-methyl-3'-butyldiphenylmethane, 4,4'-diamino-3-isopropyl-3'-butyldiphenylmethane, 2,2-bis(4-amino-3,5-dimethylphenyl)propane, 2,2-bis(4-amino-3,5-diethylphenyl)propane, 2,2-bis(4-amino-3,5-di-n-propylphenyl)propane, 2,2-bis(4-amino-3,5-diisopropylphenyl)propane, 2,2-bis(4-amino-3,5-dibutylphenyl)propane, 4,4'-diamino-3,3',5,5'-tetramethyldiphenylbenzanilide, 4,4'-diamino-3,3',5,5'-tetraethyldiphenylbenzanilide, 4,4'-diamino-3,3',5,5'-tetra-n-propyldiphenylbenzanilide, 4,4'-diamino-3,3',5,5'-tetraisopropyldiphenylbenzanilide, 4,4'-diamino-3,3',5,5'-tetrabutyldiphenylbenzanilide, 4,4'-diamino-3,3',5,5'-tetramethyldiphenylsulfone, 4,4'-diamino-3,3',5,5'-tetraethyldiphenylsulfone, 4,4'-diamino-3,3',5,5'-tetra-n-propyldiphenylsulfone, 4,4'-diamino-3,3',5,5'-tetraisopropyldiphenylsulfone, 4,4'-diamino-3,3',5,5'-tetramethyldiphenylether, 4,4'-diamino-3,3',5,5'-tetraethyldiphenylether, 4,4'-diamino-3,3',5,5'-tetra-n-propyldiphenylether, 4,4'-diamino-3,3',5,5'-tetraisopropyldiphenylether, 4,4'-diamino-3,3',5,5'-tetrabutyldiphenylether, 3,3'-diaminobenzophenon, 3,4-diaminobenzophenon, 3,3'-diaminodiphenylether, 3,3'- diaminodiphenylmethane, 3,4'-diaminodiphenylmethane, 2,2'-diamino-1,2-diphenylethane or 4,4'-diamino-1,2-diphenylethane, 2,4-diaminodiphenylamine, 4,4'-diaminooctafluorobiphenyl, o-dianisidine, and the like.

Examples of the curing agent of Formula 4 may include 1,5-diaminonaphthalene, 1,8-diaminonaphthalene, 2,3-diaminonaphthalene, and the like. Examples of the curing agent of Formula 5 include pararosaniline and the like. Examples of the curing agent of Formula 6 include 1,2-diaminoanthraquinone, 1,4-diaminoanthraquinone, 1,5-diaminoanthraquinone, 2,6-diaminoanthraquinone, 1,4-diamino-2,3-dichloroanthraquinone, 1,4-diamino-2,3-dicyano-9,10-anthraquinone, 1,4-diamino-4,8-dihydroxy-9,10-anthraquinone, and the like. Examples of the curing agent of Formula 7 include 3,7-diamino-2,8-dimethyldibenzothiphenesulfone, 2,7-diaminofluorene, 3,6-diaminocarbazole, and the like.

The phenolic and/or amine curing resin may be present in an amount of 5 to 25 parts by weight, based on 100 parts by weight of the adhesive film composition in terms of solid content.

Curing Accelerator

The adhesive composition for semiconductors may include a curing accelerator, e.g., represented by Formula 1 or 2.

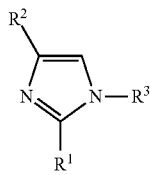

(1)

In Formula 1, $R^1$ may be hydrogen or a $C_1$-$C_{12}$ alkyl group, $R^2$ may be hydrogen or a $C_1$-$C_6$ alkyl group, $R^3$ may be a $C_1$-$C_6$ alkyl group bonded to an unsubstituted or substituted aryl or unsubstituted or substituted heteroaryl group. In an implementation, the substituted aryl group or substituted heteroaryl group may be substituted with one to three substituents selected from —COOH and —$NH_2$.

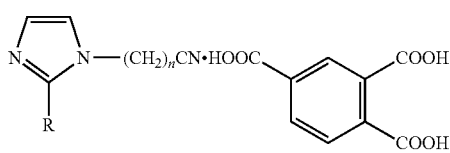

(2)

In Formula 2, R may be a $C_1$-$C_{14}$ alkyl group or a phenyl group, and n may be an integer of 1 to 6.

In an implementation, in Formula 1, $R^1$ may be hydrogen or a $C_1$-$C_{12}$ alkyl group, $R^2$ may be hydrogen or a $C_1$-$C_6$ alkyl group, and $R^3$ may be ethyl bonded to an aryl or heteroaryl group. Here, the aryl or heteroaryl group may be unsubstituted or substituted by one or two substituents selected from COOH and $NH_2$. In an implementation, in Formula 1, $R^1$ may be hydrogen, methyl or ethyl, $R^2$ may be hydrogen, methyl or ethyl, and $R^3$ may be ethyl bonded to a heteroaryl group substituted by two substituents of $NH_2$. In an implementation, the heteroaryl may be triazole. In an implementation, in Formula 2, R may be a phenyl or $C_8$ to $C_{10}$ alkyl group.

In an implementation, the imidazole curing accelerator may be selected from the group of the following compounds:

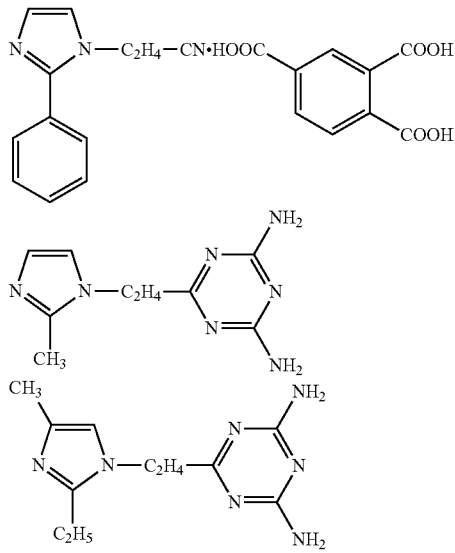

According to an embodiment, the imidazole curing accelerator represented by Formula 1 or 2 may be used as a mixture with another suitable curing accelerator. Examples of the other curing accelerator may include melamine type curing agents, microcapsule type latent curing agents, and triphenylphosphne curing catalysts, Examples of commercially available imidazole curing accelerators represented by Formula 1 or 2 may include 2MZ-A, 2E4MZ-A and 2PZCNS-PW (Asahi Kasei Corporation).

The curing accelerator may be present in an amount of 0.05 to 10 parts by weight, e.g., 0.3 to 7 parts by weight, based on 100 parts by weight of the adhesive film composition in terms of solid content. Within this range of the curing accelerator, high heat resistance, flowability, and connection performance can be attained without causing rapid reaction of the epoxy resin.

Silane Coupling Agent

The adhesive composition for semiconductors may further include a silane coupling agent. The silane coupling agent may function as an adhesion promoter to enhance adhesion between the surface of an inorganic material, such as fillers, and the organic materials via chemical coupling therebetween during blending of the composition.

Examples of a suitable silane coupling agent may include: epoxy group-containing silane coupling agents, such as 2-(3,4-epoxycyclohexyl)-ethyltrimethoxysilane, 3-glycidoxytrimethoxysilane, and 3-glycidoxypropyltriethoxysilane; amine group-containing silane coupling agents, such as N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethylbutylidene)propylamine and N-phenyl-3-aminopropyltrimethoxysilane; mercapto-containing silane coupling agents, such as 3-mercaptopropylmethyldimethoxysilane and 3-mercaptopropyltriethoxysilane; and isocyanate-containing silane coupling agents, such as 3-isocyanatepropyltriethoxysilane. These silane coupling agents may be used alone or as mixtures thereof.

The coupling agent may be present in an amount of 0.01 to 5 parts by weight, e.g., 0.1 to 3 parts by weight or 0.5 to 2 parts by weight, based on 100 parts by weight of the adhesive composition in terms of solid content. Within this range, high adhesion reliability may be obtained and the occurrence of bubbles can be reduced.

Filler

The composition may further include a filler.

The filler may include, e.g., metal powders, such as gold, silver, copper and nickel powders; and nonmetals, such as alumina, aluminum hydroxide, magnesium hydroxide, calcium carbonate, magnesium carbonate, calcium silicate, magnesium silicate, calcium oxide, magnesium oxide, aluminum oxide, aluminum nitride, silica, boron nitride, titanium dioxide, glass, iron oxide, and ceramics. In an implementation, silica may be used as the filler.

There is no particular restriction as to the shape and size of the fillers. Spherical silica or amorphous silica may be used as the fillers. The particle size of the silica may range from about 5 nm to 20 μm.

The filler may be present in an amount of 1 to 30 parts by weight, e.g., 5 to 25 parts by weight, based on 100 parts by weight of the adhesive composition in terms of solid content. Within this range, high flowability, film-forming properties, and adhesion may be obtained.

Solvent

The adhesive composition may further include a solvent. The solvent may reduce the viscosity of the adhesive composition, thereby facilitating formation of an adhesive film. Examples of solvents suitable for use in the adhesive composition may include organic solvents such as toluene, xylene, propylene glycol monomethyl ether acetate, benzene, acetone, methyl ethyl ketone, tetrahydrofuran, dimethylformamide, and cyclohexanone.

Another embodiment relates to an adhesive film for semiconductors including the adhesive composition according to an embodiment. There is no need for a special apparatus or equipment for forming an adhesive film for semiconductors using the adhesive composition according to an embodiment, and a suitable method may be used to manufacture the adhesive film. For example, the respective components may be dissolved in a solvent, and sufficiently kneaded using a bead-mill, followed by depositing the resultant on a polyethylene terephthalate (PET) film subjected to release treatment, and drying in an oven at 100° C. for 10–30 minutes to prepare an adhesive film having a suitable thickness.

In an implementation, the adhesive film for semiconductors may include a base film, an adhesive layer, a bonding layer, and a protective film, which are sequentially stacked in this order.

The adhesive film may have a thickness of 5 μm to 200 μm, e.g., 10 μm to 100 μm. Within this range, the adhesive film may exhibit sufficient adhesion while providing economic feasibility. In an implementation, the adhesive film may have a thickness of 15 μm to 60 μm.

Another embodiment relates to a semiconductor device connected using the adhesive film for semiconductors according to an embodiment or the adhesive composition for semiconductors according to an embodiment.

FIG. 1 illustrates a side sectional view of a semiconductor device according to an embodiment. Referring to FIG. 1, the semiconductor device may include a substrate 3, an adhesive layer 2 on the substrate 3, and a semiconductor chip 6 on the adhesive layer 2.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE

Examples 1-3

Preparation of Adhesive Composition for Semiconductors

A solvent (cyclohexanone) was added to a thermoplastic resin, an epoxy resin, a phenolic curing agent, a curing accelerator, fillers, and a silane coupling agent, as listed in Table 1, below, such that the solid content in the solution was 40% by weight, followed by sufficiently kneading using a bead-mill, thereby preparing an adhesive composition for semiconductors.

Comparative Examples 1-3

Preparation of Adhesive Composition for Semiconductors

Adhesive compositions for semiconductor were prepared in the same manner as in Examples 1 to 3, except for using components as listed in Table 1.

Respective components used in the Examples and the Comparative Examples were as follows.

TABLE 1

|    | Solid content (%) | Example 1 | Example 2 | Example 3 | Comparative Example 1 | Comparative Example 2 | Comparative Example 3 |
|----|------|-------|-------|-------|-------|-------|-------|
| A  | 15   | 22.68 | 21.88 | 22.08 | 22.98 | 22.58 | 22.58 |
| B1 | 49.9 | 7.0   | 28.51 | 29.60 | 2.0   | 7.4   | 29.51 |
| B2 | 80.4 | 28.51 |       | 2.1   | 26.51 | 28.51 |       |
| C1 | 58.9 | 10.71 | 16.41 | 16.41 | 16.41 | 10.41 | 16.81 |
| D1 | 100  | 0.1   |       |       |       |       |       |
| D2 | 100  |       | 0.1   |       |       |       |       |
| D3 | 100  |       |       | 0.1   |       |       |       |
| D4 | 100  |       |       |       | 0.1   |       |       |
| D5 | 100  |       |       |       |       | 0.1   |       |
| D6 | 100  |       |       |       |       |       | 0.1   |

TABLE 1-continued

| | Solid content (%) | Example 1 | Example 2 | Example 3 | Comparative Example 1 | Comparative Example 2 | Comparative Example 3 |
|---|---|---|---|---|---|---|---|
| E | 100 | 1 | 1 | 1 | 1 | 1 | 1 |
| F | 100 | 30 | 30 | 31 | 31 | 30 | 30 |
| | | 100 | 100 | 100 | 100 | 100 | 100 |

(A) Thermoplastic resin: SG-P3 (Nagase Chemtex Co., Ltd.)
(B1) Epoxy resin: YDCN-500-1P (Kukdo Chemical Co., Ltd.)
(B2) Epoxy resin: EPPN-501H (Nippon Kayaku Co., Ltd.)
(C1) Phenolic curing resin: HF-1M (Eq.: 106, Meiwa Chemicals Co., Ltd.)
(D1) Curing accelerator: 2E4MZ-A (Shikoku chemicals Co., Ltd.)
(D2) Curing accelerator: 2PZCNS-PW (Shikoku chemicals Co., Ltd.)
(D3) Curing accelerator: 2MZ-A (Shikoku chemicals Co., Ltd.)
(D4) Curing accelerator: TBZ (Shikoku chemicals Co., Ltd.)
(D5) Curing accelerator: 2P4MZ (Shikoku chemicals Co., Ltd.)
(D6) Curing accelerator: 2E4MZ (Shikoku chemicals Co., Ltd.)
(E) Silane coupling agent: KBM-403 (Shinetsu Co., Ltd.)
(F) Spherical silica: SO-25H, (ADMATECH)

Preparation of Adhesive Film

Each of the adhesive compositions prepared in Examples 1 to 3 and Comparative Examples 1 to 3 was deposited on a PET film subjected to release treatment using an applicator, followed by drying in an oven at 100° C. for 10~30 minutes, thereby providing a 60 μm thick adhesive film.

Experimental Example: Evaluation of physical properties of adhesive film prepared using adhesive composition in the Examples and Comparative Examples The physical properties of each of the adhesive films prepared using the adhesive compositions of Examples 1 to 3 and Comparative Examples 1 to 3 were evaluated by the following method, and results are shown in Table 2.

(1) Void 1: The semiconductor adhesive composition prepared to contain less than 1% of a residual solvent was laminated between glass slides at 60° C. to form a 50~60 μm thick adhesive layer, which in turn was sequentially cured in an oven at 125° C. for 10 minutes and on a hot plate at 150° C. for 5 minutes. Then, the cured adhesive layer was photographed using a microscope (magnification of 25×) to digitize an area of voids with respect to a measured area through image analysis.

Void proportion=(void area/total area)×100

(2) Void 2: The semiconductor adhesive composition prepared to contain less than 1% of a residual solvent was laminated between glass slides at 60° C. to form a 50~60 μm thick adhesive layer, which in turn was sequentially cured in an oven at 125° C. for 10 minutes, on a hot plate at 150° C. for 5 minutes, and at 170° C. for 1 minute. Then, the cured adhesive layer was photographed using a microscope (magnification of 25×) to digitize an area of voids with respect to a measured area through image analysis.

Void proportion=(void area/total area)×100.

(3) DSC curing rate in each stage: The weight of the DSC pan was measured using the prepared film, and about 0.4~1.0 mg of the film was placed in the pan. After recording the weight of the DSC pan, the pan was closed by a lid and the DSC curing rate was measured in a temperature range of 50° C.~300° C. using DSC. Measurement of the DSC curing rage was carried out using samples obtained in the same manner after heat treatment in an initial stage after film coating, in a first stage at 125° C. for 10 minutes, in a second stage at 150° C. for 5 minutes, in a third stage at 175° C. for 1 minute, and in a fourth stage at 175° C. for 1 hour.

(4) Die Shear Strength 1: A 530 μm thick wafer was cut into chips having a size of 5 mm×5 mm. The chips were laminated with each of the adhesive films at 60° C., which in turn were cut to leave behind a bonded portion only. An upper chip having a size of 5×5 mm was placed on a wafer having a size of 10×10 mm, followed by curing in an oven

TABLE 2

| Test | Example 1 | Example 2 | Example 3 | Comparative Example 1 | Comparative Example 2 | Comparative Example 3 |
|---|---|---|---|---|---|---|
| Void 1 (%) | 0.75 | 1.20 | 1.00 | 17.25 | 25.00 | 12.5 |
| Void 2 (%) | 0.75 | 1.30 | 1.00 | 19.20 | 28.30 | 17.3 |
| DSC curing rate (%) in first stage | 37.0 | 35.2 | 36.4 | 58.9 | 51.2 | 67.2 |
| DSC curing rate (%) in second stage | 53.2 | 49.7 | 51.1 | 77.3 | 74.3 | 81.6 |
| DSC curing rate (%) in third stage | 58.3 | 56.2 | 57.2 | 82.1 | 79.3 | 85.4 |
| DSC curing rate (%) in fourth stage | 100 | 100 | 100 | 100 | 100 | 100 |
| die shear strength 1 | 2.5 | 2.72 | 3.1 | 1.43 | 1.35 | 1.02 |
| die shear strength 2 | 14.5 | 15.1 | 16.2 | 6.3 | 7.8 | 5.2 |
| Die deviation after molding | Not occurred | Not occurred | Not occurred | Not occurred | Not occurred | Not occurred |
| Reflow resistance Test | 0/35 | 0/35 | 0/35 | 3/35 | 8/35 | 33/35 | at 125° C. for 10 minutes and on a hot plate at 150° C. for 5 minutes. Then, the die shear strength was measured at 175° C. Results are shown in Table 2.

(5) Die Shear Strength 2: A 530 μm thick wafer was cut into chips having a size of 5×5 mm. The chips were laminated with each of the adhesive films at 60° C., and were cut to leave behind a bonded portion only. An upper chip having a size of 5×5 mm was placed on a wafer having a size of 10×10 mm, followed by application of a force of 10 kgf on a hot plate at 120° C. for 1 second to attach the chip to the wafer, followed by curing in an oven at 125° C. for 10 minutes, curing on a hot plate at 150° C. for 5 minutes, and at 175° C. for 1 hour. The prepared specimen was allowed to absorb moisture at 85° C./85% RH for 168 hours, and reflow was conducted three times at a maximum temperature of 260° C. Then, the die shear strength was measured at 250° C. Results are shown in Table 2.

(6) Die deviation after molding: Each of the prepared films was mounted on a 100 μm thick wafer coated with a dioxide layer and cut into chips having a size of 8×8 mm and a size of 10×10 mm. Then, the chips were attached in two layers to a QDP package, followed by curing in an oven at 125° C. for 10 minutes and on a hot plate at 150° C. for 5 minutes. The resulting package was molded with an EMC (SG-8500BC, Cheil Industries, Korea) at 175° C. for 60 seconds. Then, die deviation was observed by scanning acoustic tomography (SAT). 10% or more deviation from an original attachment position was determined as deviation.

(7) Reflow resistance test: Each of the prepared adhesive films was mounted on a 100 μm thick wafer and cut into chips having a size 8×8 mm and a size 10×10 mm. The chips were attached in two layers to a QDP package. The resulting package was molded with an EMC(SG-8500BC, Cheil Industries, Korea) at 175° C. for 60 seconds, followed by post-curing in an oven at 175° C. for 2 hours. The prepared specimen was allowed to absorb moisture at 85° C./85% RH for 168 hours, and reflow was conducted three times at a maximum of 260° C. Then, cracks were observed on the specimen.

By way of summation and review, during the die-attach curing process at a temperature of 125° C.~150° C., DAF may increase in flowability, and curing may be carried out while filling voids generated during the die-attach process. In this case, if flowability increases and sufficient curing are not obtained, bubble type voids may be generated due to exposure to high temperature during subsequent processes (wire bonding, EMC (Epoxy-Mold Curing), or the like) before sufficiently stable increase in curing density. Such bubble type voids may expand or increase during the thermal process and additionally may expand due to thermal shock during a thermal process such as reflow after EMC molding, thereby causing reliability issues, e.g., popcorn cracking and swelling of DAF. When a curing accelerator having rapid curing characteristics is used to help suppress such characteristics of the bubble type voids, the curing rate for a reduced curing time may be increased. In this case, however, first, reaction stability at temperatures on a drying stage in manufacture of DAF may be lowered, and second, the modulus of DAF may increase due to rapid reactivity at an initial stage, thereby causing deterioration in gap-filling and void removal characteristics in the die-attach curing process. In addition, the high curing rate at an initial stage may cause an increase of an inner temperature of DAF due to a highly exothermic curing reaction inside DAF, and undesirable generating and expanding the bubble type voids may become severe due to such thermal shock.

To help reduce and/or prevent such undesirable occurrences, a curing system having the following characteristics may be desirable. First, a curing accelerator selected for the curing system may be capable of securing a sufficient curing rate at 125~150° C. for a curing time of less than 1 hour. For example, the curing accelerator may allow a curing rate of an initial die-attach curing process to reach 10~40% of the total curing rate to help secure a minimum curing rate capable of guaranteeing reliability of DAF through subsequent thermal processes, and may provide a curing rate that increases in a stepwise manner through subsequent thermal processes. Second, a curing reaction by the curing accelerator may occur at a stepwise increasing curing rate through the respective thermal processes, which may include a curing process at 125° C. for 20 minutes, a wire bonding process at 150° C. for 5 minutes, and an EMC molding process at 175° C. for 1 minute, the curing rate of the curing process at 125° C. for 10 minutes may be 40% or less of the total curing rate (100%), and each of the wire bonding and EMC processes may have a curing rate that gradually increases in a stepwise manner, thereby preventing expansion and generation of voids due to increase in inner temperature of DAF by a highly exothermic curing reaction in DAF.

An adhesive film for semiconductors may employ two kinds of curing accelerators having different reaction temperature ranges to allow removal of voids upon EMC molding by imparting a residual curing rate even after post-die attach curing. In addition, an adhesive may include a composition having a relatively low curing temperature and a composition having a relatively high curing temperature to adjust curing rate. Such adhesive films may undergo excessive curing in an oven curing process after die-attachment or may have an insufficient residual curing rate in a PMC process, so that generation and expansion of voids may not be suppressed.

The embodiments may provide an adhesive composition for semiconductors and an adhesive film including the same, which may allow curing rate to increase in a stepwise manner, thereby suppressing expansion and generation of voids due to increase in inner temperature of DAF caused by a highly exothermic curing reaction.

Another embodiment may provide an adhesive composition for semiconductors and an adhesive film including the same, which may allow curing reaction to gradually proceed according to thermal processes, thereby preventing generation of voids while providing excellent results in adhesion and reflow resistance testing.

Another embodiment may provide an adhesive composition for semiconductors and an adhesive film including the same, which has a void proportion of less than 20% in a third stage at 160° C. to 180° C. for 30 seconds to 10 minutes, e.g., in an EMC molding process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An adhesive film for semiconductors, the adhesive film consisting of, based on 100 parts by weight of the adhesive film in terms of solid content:

10 to 60 parts by weight of a thermoplastic resin;

15 to 40 parts by weight of an epoxy resin;

5 to 25 parts by weight of at least one curing resin, the at least one curing resin being a phenolic curing resin containing two or more phenolic hydroxyl groups per molecule or an aromatic amine curing resin, the aromatic amine curing resin including at least two amine groups and being represented one of Formulae 3 to 7, below, provided that the aromatic amine curing resin does not include a diaminodiphenyl methane, a diaminodiphenyl sulfone, a diaminodiphenyl ether, or 1,5-diaminonaphthalene;

0.05 to 10 parts by weight of an imidazole curing accelerator represented by Formula 1 or 2, below; and 1 to 30 parts by weight of a filler,

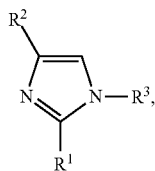
(1)

wherein, in Formula 1, $R^1$ is hydrogen or a $C_1$-$C_{12}$ alkyl group, $R^2$ is hydrogen or a $C_1$-$C_6$ alkyl group, $R^3$ is a $C_1$-$C_6$ alkyl group bonded to an unsubstituted or substituted aryl or unsubstituted or substituted heteroaryl group, the substituted aryl group or the substituted heteroaryl group being substituted by one to three substituents selected from —COOH and —NH$_2$,

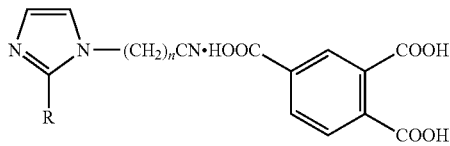
(2)

wherein, in Formula 2, R is a $C_1$-$C_{14}$ alkyl group or a phenyl group and n is an integer of 1 to 6,

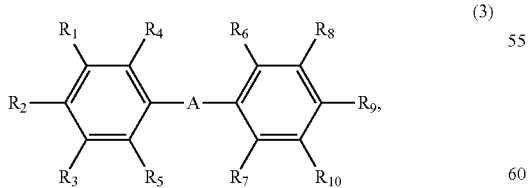
(3)

wherein, in Formula 3, A is a single bond, —CH$_2$—, —CH$_2$CH$_2$—, —SO$_2$—, —NHCO—, —C(CH$_3$)$_2$—, or —O—, $R_1$ to $R_{10}$ are each independently hydrogen, a $C_1$-$C_4$ alkyl group, a $C_1$-$C_4$ alkoxy group, or an amine group, at least two of $R_1$ to $R_{10}$ being amine groups,

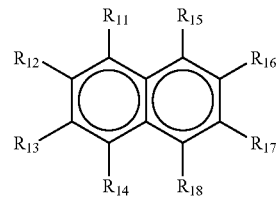
(4)

wherein, in Formula 4, $R_{11}$ to $R_{18}$ are each independently an amine group, hydrogen, a $C_1$ to $C_4$ alkyl group, an alkoxy group, a hydroxyl group, a cyanide group, or a halogen, at least two of $R_{11}$ to $R_{18}$ being amine groups,

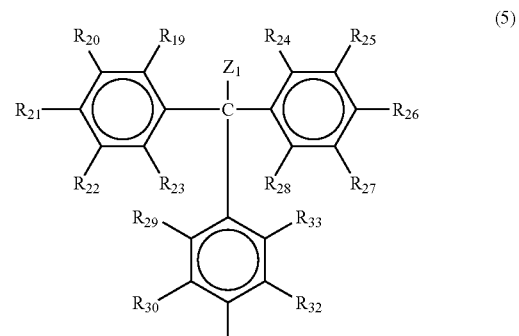
(5)

wherein, in Formula 5, $Z_1$ is hydrogen, a C1 to C4 alkyl group, an alkoxy group, or a hydroxyl group; $R_{19}$ to $R_{33}$ are each independently an amine group, hydrogen, a $C_1$ to $C_4$ alkyl group, an alkoxy group, a hydroxyl group, a cyanide group, or a halogen, at least two of $R_{19}$ to $R_{33}$ being amine groups,

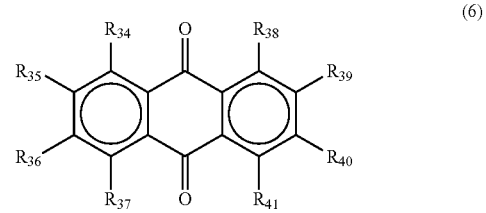
(6)

wherein, in Formula 6, $R_{34}$ to $R_{41}$ are each independently an amine group, hydrogen, a $C_1$ to $C_4$ alkyl group, an alkoxy group, a hydroxyl group, a cyanide group, or a halogen, at least two of $R_{34}$ to $R_{41}$ being amine groups, and

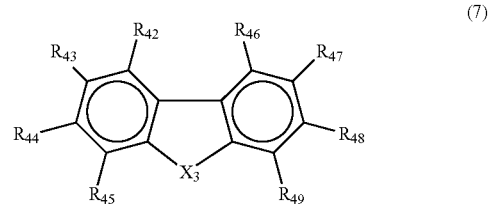
(7)

wherein, in Formula 7, $X_3$ is —CH$_2$—, —NH—, —SO$_2$—, —S—, or —O—; and $R_{42}$ to $R_{49}$ are each independently an amine group, hydrogen, a $C_1$ to $C_4$ alkyl group, an alkoxy group, a hydroxyl group, a cyanide group, or a halogen, at least two of $R_{42}$ to $R_{49}$ being amine groups.

2. An adhesive film for semiconductors, wherein:
the adhesive film is the adhesive film as claimed in claim 1, and
in a curing process including a first stage at a temperature ranging from 120° C. to 130° C. for 1 to 20 minutes, a second stage at a temperature ranging from 140° C. to 150° C. for 1 to 10 minutes, a third stage at a temperature ranging from 160° C. to 180° C. for 30 seconds to 10 minutes, and a fourth stage at a temperature ranging from 160° C. to 180° C. for 10 minutes to 2 hours, the adhesive film has a DSC curing rate in the first stage that is 40% or less of a total curing rate, a DSC curing rate in the fourth stage that is 30 to 60 percentage points higher than a DSC curing rate in the third stage, and DSC curing rates in each of the second and third stages that are 5 percentage points or more higher than a DSC curing rate of a preceding stage thereof.

3. The adhesive film as claimed in claim 2, wherein:
the DSC curing rate in the second stage is 5 to 50 percentage points higher than the DSC curing rate in the first stage, and
the DSC curing rate in the third stage is 5 to 25 percentage points higher than the DSC curing rate in the second stage.

4. The adhesive film as claimed in claim 2, wherein the imidazole curing accelerator is selected from the group of:

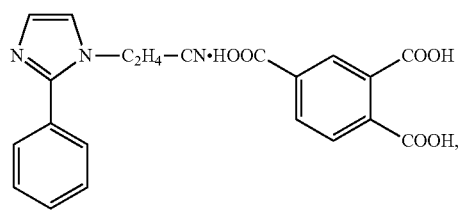

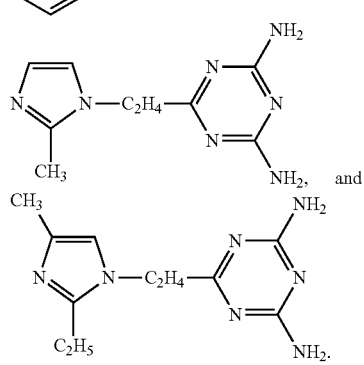

5. A semiconductor device connected using the adhesive film for semiconductors as claimed in claim 2.

6. An adhesive film for semiconductors, the adhesive film being the adhesive film as claimed in claim 1 and having:
a void proportion of less than 10% after sequentially curing at 120° C. to 130° C. for 1 to 20 minutes and at 140° C. to 150° C. for 1 to 10 minutes, and
a void proportion of less than 20% after sequentially curing at 120° C. to 130° C. for 1 to 20 minutes, at 140° C. to 150° C. for 1 to 10 minutes and at 160° C. to 180° C. for 30 seconds to 10 minutes.

7. The adhesive film as claimed in claim 6, wherein the adhesive film has a die shear strength of 1 kgf/chip or more after sequentially curing at 120° C. to 130° C. for 1 to 20 minutes and at 140° C. to 150° C. for 1 to 10 minutes.

8. The adhesive film as claimed in claim 6, wherein the adhesive film has a die shear strength of 10.0 kgf/chip or more after chip bonding at 120° C. for 1 second and followed by sequentially curing at 120° C. to 130° C. for 1 to 20 minutes, at 140° C. to 150° C. for 1 to 10 minutes, at 160° C. to 180° C. for 30 seconds to 10 minutes and at 160° C. to 180° C. for 10 minutes to 2 hours, and reflow three times at 260° C.

9. The adhesive film as claimed in claim 1, wherein an amount of the thermoplastic resin is less than or equal to a sum of the amounts of the epoxy resin and the curing resin, in terms of solid content.

10. A semiconductor device connected using the adhesive film as claimed in claim 1.

11. The semiconductor device as claimed in claim 10, wherein the semiconductor device includes a substrate, an adhesive layer on the substrate, and a semiconductor chip on the adhesive layer such that the adhesive layer is between the semiconductor chip and the substrate.

12. The adhesive film as claimed in claim 1, wherein the curing resin includes the phenolic curing resin containing two or more phenolic hydroxyl groups per molecule.

13. The adhesive film as claimed in claim 1, wherein the imidazole curing accelerator is represented by Formula 1' or 2', below:

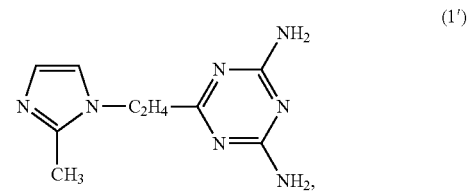

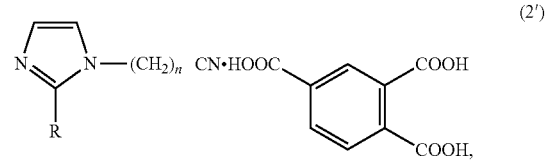

wherein, in Formula 2', R is a $C_1$-$C_{14}$ alkyl group or a phenyl group and n is an integer of 1 to 6.

14. The adhesive film as claimed in claim 1, wherein the imidazole curing accelerator is:

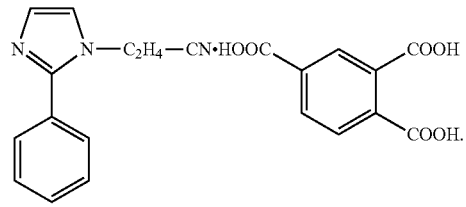

15. The adhesive film as claimed in claim 1, wherein the curing resin includes the aromatic amine curing resin including at least two amine groups, the aromatic amine curing resin including at least two amine groups being represented one of Formulae 4 to 7, below:

(4)

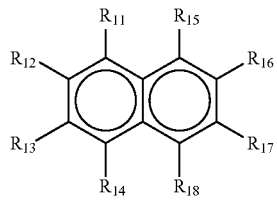

wherein, in Formula 4, $R_{11}$ to $R_{18}$ are each independently an amine group, hydrogen, a $C_1$ to $C_4$ alkyl group, an alkoxy group, a hydroxyl group, a cyanide group, or a halogen, at least two of $R_{11}$ to $R_{18}$ being amine groups, (5)

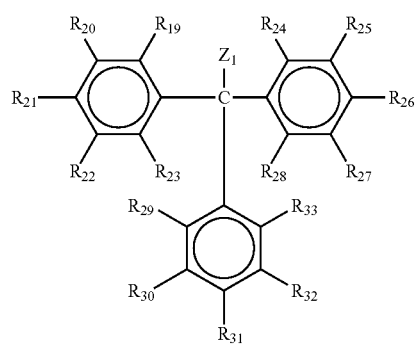

wherein, in Formula 5, $Z_1$ is hydrogen, a C1 to C4 alkyl group, an alkoxy group, or a hydroxyl group; $R_{19}$ to $R_{33}$ are each independently an amine group, hydrogen, a $C_1$ to $C_4$ alkyl group, an alkoxy group, a hydroxyl group, a cyanide group, or a halogen, at least two of $R_{19}$ to $R_{33}$ being amine groups, (6)

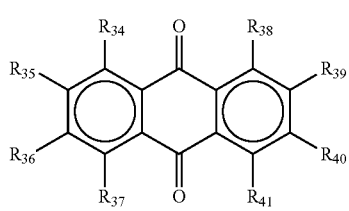

wherein, in Formula 6, $R_{34}$ to $R_{41}$ are each independently an amine group, hydrogen, a $C_1$ to $C_4$ alkyl group, an alkoxy group, a hydroxyl group, a cyanide group, or a halogen, at least two of $R_{34}$ to $R_{41}$ being amine groups, and (7)

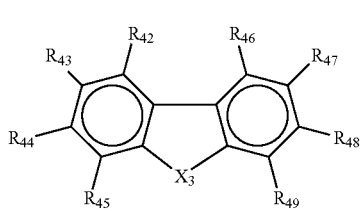

wherein, in Formula 7, $X_3$ is —$CH_2$—, —NH—, —$SO_2$—, —S—, or —O—; and $R_{42}$ to $R_{49}$ are each independently an amine group, hydrogen, a $C_1$ to $C_4$ alkyl group, an alkoxy group, a hydroxyl group, a cyanide group, or a halogen, at least two of $R_{42}$ to $R_{49}$ being amine groups.

* * * * *